United States Patent
Lee et al.

(10) Patent No.: US 7,660,646 B2
(45) Date of Patent: Feb. 9, 2010

(54) SYSTEM AND METHOD PROVIDING CONTROL OF RETICLE STOCKING AND SORTING

(75) Inventors: Yao-Chin Lee, Hsinchu (TW); Chia-Yun Tsao, Tianan (TW); Chih-Yee Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 615 days.

(21) Appl. No.: 10/810,932

(22) Filed: Mar. 26, 2004

(65) Prior Publication Data

US 2005/0216117 A1  Sep. 29, 2005

(51) Int. Cl.
*G06F 7/00* (2006.01)
*G06F 19/00* (2006.01)

(52) U.S. Cl. .................. 700/214; 700/99; 700/101; 414/935

(58) Field of Classification Search ............... 700/215, 700/214, 228, 213, 229, 99, 100, 101, 102, 700/112; 414/935, 940, 805, 806
See application file for complete search history.

(56) References Cited

U.S. PATENT DOCUMENTS

| | | | | |
|---|---|---|---|---|
| 6,535,778 | B2 * | 3/2003 | Okabe et al. | 700/112 |
| 6,579,052 | B1 * | 6/2003 | Bonora et al. | 414/222.01 |
| 6,748,292 | B2 * | 6/2004 | Mountz | 700/214 |
| 2001/0047222 | A1 * | 11/2001 | Wiesler et al. | 700/214 |
| 2003/0204280 | A1 * | 10/2003 | Kobayashi | 700/101 |
| 2006/0195209 | A1 * | 8/2006 | Tseng et al. | 700/99 |

* cited by examiner

*Primary Examiner*—Gene Crawford
*Assistant Examiner*—Ramya Prakasam
(74) *Attorney, Agent, or Firm*—Thomas, Kayden, Horstemeyer & Risley

(57) ABSTRACT

A reticle stocking and sorting system. The reticle management system comprises first reticle storage, second reticle storage, third reticle storage, and a host system. The first reticle storage stores a first reticle currently in use. The second reticle storage stores a second reticle not currently in use. The third reticle storage stores a third unused reticle temporarily before it is disposed of. The host system is adapted to rearrange the first, second, and third reticles among the first, second, and third reticle storages, based on demand data pertaining to a product requiring least one article during fabrication.

17 Claims, 5 Drawing Sheets

SYSTEM AND METHOD PROVIDING CONTROL OF RETICLE STOCKING AND SORTING

BACKGROUND

The present invention relates to a tool management system and particularly to a system providing control of reticle stocking and sorting operations in a semiconductor fabrication system.

Depending on the type of IC device being manufactured, a wafer may be subjected to several photolithography processes as layers are formed successively to form the device. To perform the various photolithography processes, a semiconductor plant has a photolithography area comprising a number of steppers that utilize a cataloged library of reticles. The number of reticles that need to be readily available can easily exceed one thousand, due to the number of different products that can be manufactured in one facility, with each reticle having a replacement cost of about $1,500. The reticles are usually stored in a reticle storage system, centrally located within the photolithography area, and are cataloged by reticle identification number. The reticle(s) are transported via a conveyor system to the particular stepper awaiting a certain reticle. One problem with managing reticles is that they are very delicate structures and can be easily damaged in handling. They are also routinely inspected to ensure that they are still viable for use.

These reticles have not only high replacement cost, but also high maintenance cost. Reticles occupy storage and substantial floor space, creating considerable traffic congestion in the fabrication system.

The reticles are generally owned by customers rather than a fabrication plant. The fabrication plant bears the responsibility of maintaining the reticles, and lack authority to phase out or scrap reticles without customer permission.

FIG. 1 is a schematic view showing a conventional method of reticle management. Reticles are stored in online reticle storage 11, offline reticle storage 13, or reticle outlet 15. The reticles are then transported by transport devices 12, 14, and 16. The current position and other related information is stored in a reticle management center 17. When reticles are conventionally utilized in a fabrication process within a fabrication system 10, they are stored in online reticle storage 11 awaiting transport to a processing area. These reticles lie idle in the online reticle storage 11 not in use. When idle time of the reticles exceeds a preset time period, manual intervention is required to move these idle reticles from the online reticle storage 11 to the offline reticle storage 13. These reticles are moved back to the online reticle storage 11 when needed for fabrication processes. Generally, the activation of the idle reticles is initiated by a product order pertaining to these reticles. When the idle reticles stay in the offline reticle storage 13 longer than a preset time period, they should be moved from the offline reticle storage 13 to the reticle outlet 15. At the same time, a customer engineer 18 of the fabrication system 10 checks the reticle idle state from a reticle management center 17, informs the owner 19 (customer) of the reticles in this idle state and requests disposition of the reticles. If the customer wishes to take possession of the idle reticles, the reticles are returned. If the customer declines to take possession, the reticles are scraped shortly thereafter.

Such conventional reticle management system has several disadvantages.

First, the conventional system leads to redundant reticle transport among the online reticle storage 11, the offline reticle storage 13, and the reticle outlet 15. In the conventional system, idle reticles are moved from online to offline reticle storage when the idle time of the reticles exceeds a preset time period, and are returned to the online reticle storage 11 when required by any fabrication process. The transport of reticle from the online reticle storage 11 to the offline reticle storage 13 is executed manually, with idle time the sole factor impacting transport decisions. Thus, reticles can be characterized as idle and returned to the offline reticle storage, even though a pertinent process operation, requiring their use, may resume as soon as one day later. After the reticles reach the offline reticle storage, they are restored to the online reticle storage when the process operation resumes. This round trip in a short time consumes transport capacity of the fabrication system, and requires an excess of manual attention, lowering overall efficiency of the fabrication system.

Second, considerable communication is required when querying customers for disposition instructions for the reticles. Since reticles have high replacement cost and are of major importance in the fabrication process, disposition is deployed carefully, with erroneous disposition resulting in serious consequences. Generally, a decision regarding reticle disposition only follows repeated discussion and confirmation through complex paperwork and processes.

Third, there is no flexibility in setting the time limit for different customers and products. All reticles in the online reticle storage have the same idle time limits, as do the reticles in the offline storage, despite the fact that reticles may belong to different customers and pertain to different products, all with discrete needs and practices. Some customers may order frequently, some infrequently, and others sporadically. Similarly, different products are characterized by different order patterns. The conventional system assigns a single idle time limit to all reticles and passes over the above-mentioned differences without due attention.

Hence, there is a need for a reticle management system that addresses the inefficiency arising from the existing technology.

SUMMARY

It is therefore an object of the invention to provide a system and method of reticle management reducing redundant reticle transport.

It is another object of the invention to provide a system and method of reticle management reducing communication required by inquiry and confirmation of reticle disposition.

It is still another object of the invention to provide a system and method of reticle management with flexible time limit setting capability.

To achieve these and other objects, the present invention provides a demand-based reticle management mechanism.

According to one embodiment of the invention, a reticle management system is provided within a fabrication system. The reticle management system comprises first reticle storage, second reticle storage, third reticle storage, and a host system.

The first reticle storage stores a first reticle currently in use. The second reticle storage stores a second reticle not currently in use. The third reticle storage stores a third unused reticle temporarily before it is disposed of. The host system is adapted to rearrange the first, second, and third reticles among the first, second, and third reticle storages, based on demand data pertaining to a product requiring least one reticle during fabrication.

According to another embodiment of the invention, a method is provided for managing the reticles among the three storage locations mentioned. The method rearranges the first, second, and third reticles among the first, second, and third storages according to demand data for a product. The product's manufacture requires at least one of the reticles, and the demand data is order or order prediction data. In order to manage the first reticle stored in the first storage, a first time limit is determined. Next, a first idle time of the first reticle is calculated. The first idle time is reset when demand data of the product corresponding to the first reticle is received. When the first idle time exceeds the first time limit, a first transfer command is issued to move the first reticle from the first storage to the second storage. Similarly, in order to manage the second reticle stored in the second storage, a second time limit is determined. Next, a second idle time of the second reticle is calculated. When demand data of the product requiring the second reticle is received, a first return command is issued to move the second reticle from the second reticle storage to the first reticle storage. When the second idle time exceeds the second time limit, a second transfer command is issued to move the second reticle from the second storage to the third storage. When demand data of the product corresponding to the third reticle is received, a second return command is issued to move the third reticle from the third storage to the second storage. This method may take the form of program code embodied in a tangible media. When the program code is loaded into and executed by a machine, the machine becomes an apparatus for practicing the invention.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

The present invention will now be described with reference to FIGS. 2 to 4, which in general relate to a reticle management system within a fabrication system. While the preferred embodiment of the invention operates with semiconductor fabrication systems, it is understood that the type of article processed by the fabrication system is not critical to the present invention, and any fabrication system using tools owned by customers (such as reticles) may utilize the present invention.

Figure 1:
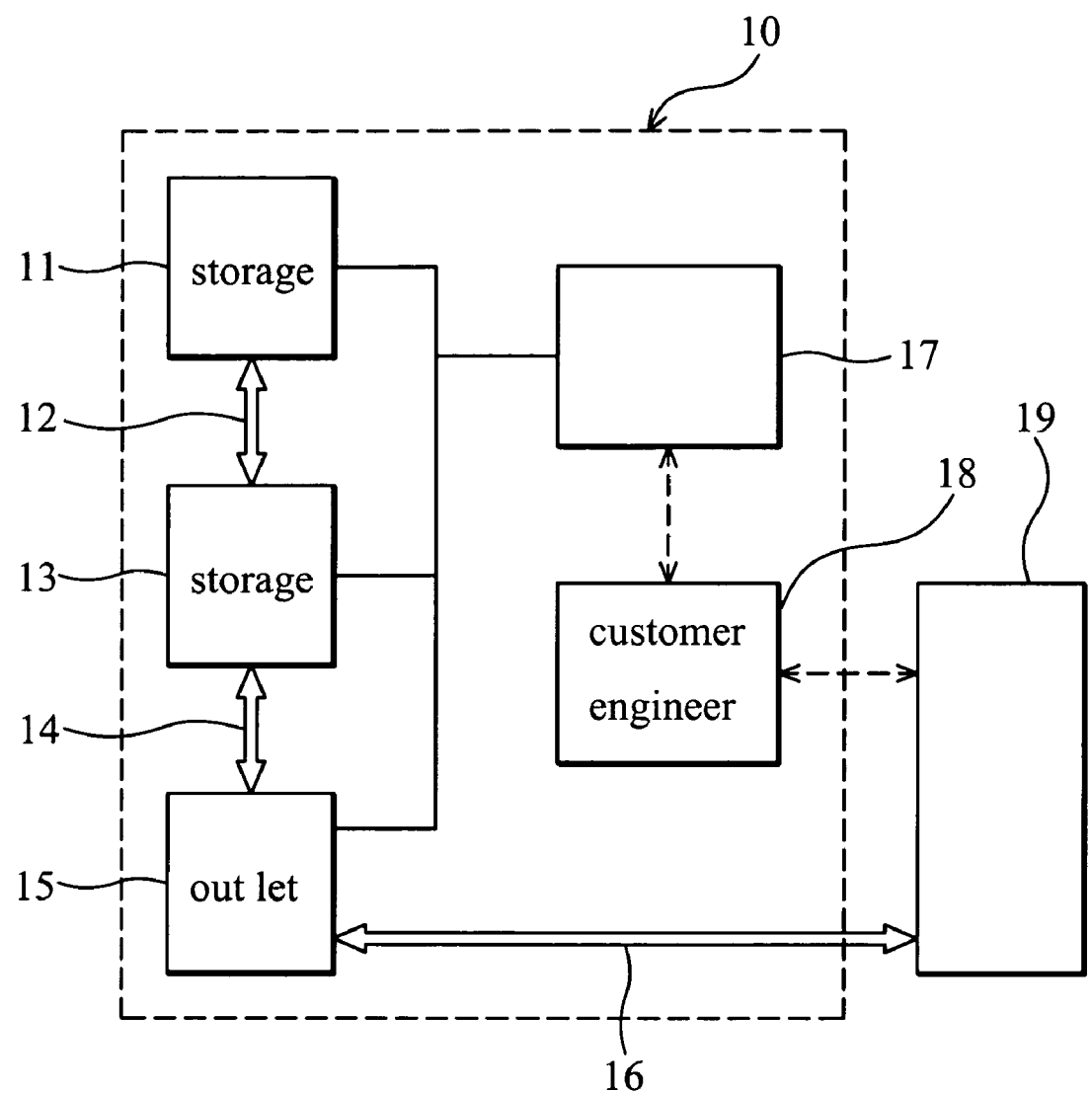
FIG. 1 is a schematic view showing a conventional operation of reticle management.
Figure 2:
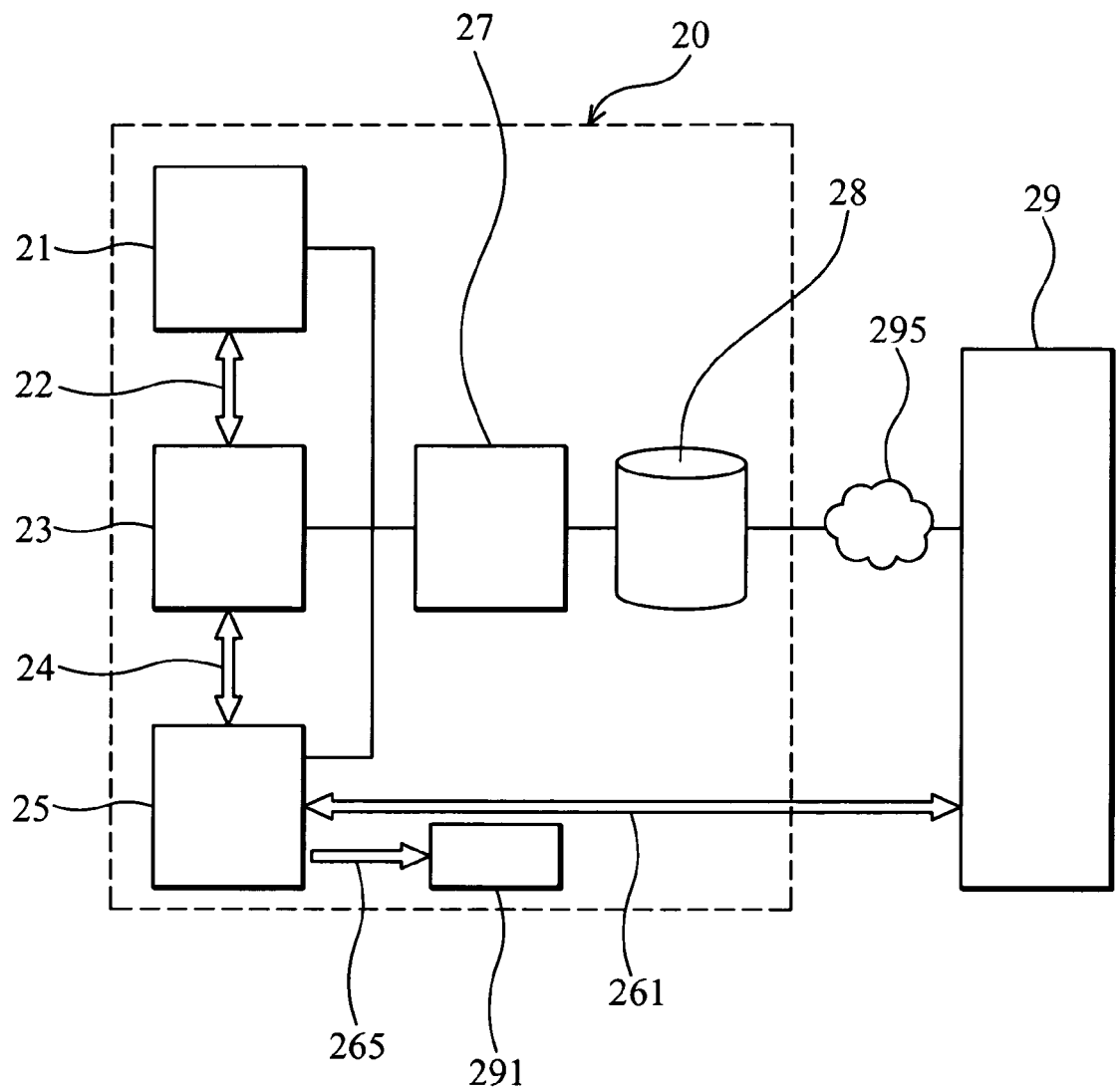
FIG. 2 is a schematic view showing the operation of reticle management according to the present invention.

FIG. 2 is a schematic view showing the operation of reticle management according to the present invention. A fabrication system 20 is a semiconductor fabrication system comprising online reticle storage 21, offline reticle storage 23, reticle outlet 25, a reticle management center 27, and an order database 28.

The online reticle storage stores a first reticle currently in use in a fabrication process. The offline reticle storage stores a second reticle not currently in use. The reticle outlet serves as an outlet of a third reticle, which will be sent to a scrap mill 291 or returned to its owner, customer 29. A transport device 22, linked with the online reticle storage 21 and the offline reticle storage 23, transports reticles therebetween. A transport device 24, linked with the offline reticle storage 23 and the reticle outlet 25, transports reticles therebetween. A transport device 261 transports reticles between the reticle outlet 25 and a reticle storage of the customer 29. A transport device 265 transports reticles from the reticle outlet 25 to the scrap mill 291.

The reticle management center 27 is adapted to relocate the first, second, and third reticles among the online and offline storages, and the reticle outlet, based on demand data pertaining to a product, which uses at least one of the reticles during its fabrication process. The demand data, retrieved from an order database, is order or order prediction data determined by the customer 29. The order database 28 is connected with the customer 29 through a network 295. The customer 29 uploads the order or order prediction data to the database 28 through a GUI and the network 295.

Figure 3A:
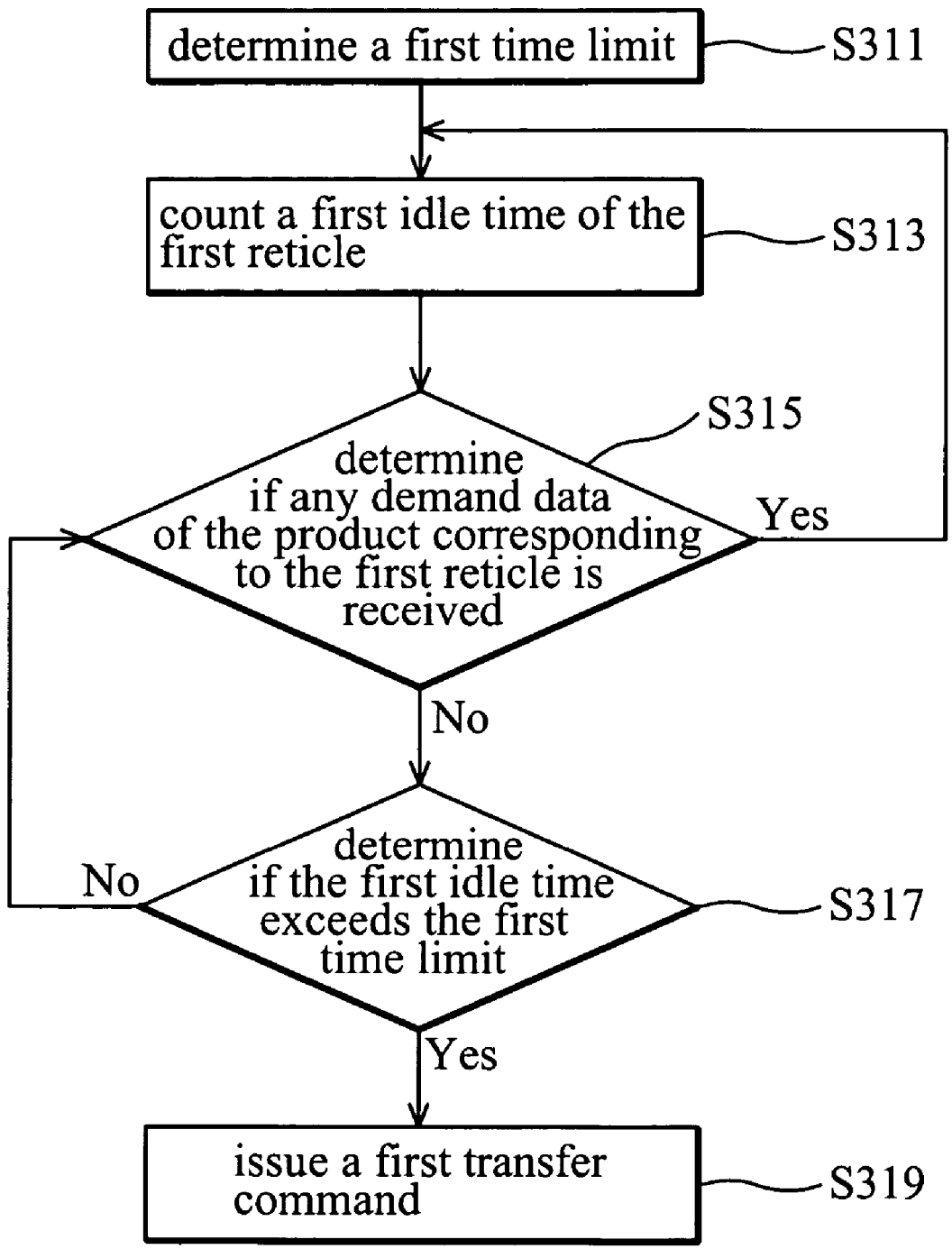
FIGS. 3A and 3B are flowcharts of the reticle management operation of the system in FIG. 2.
Figure 3B:
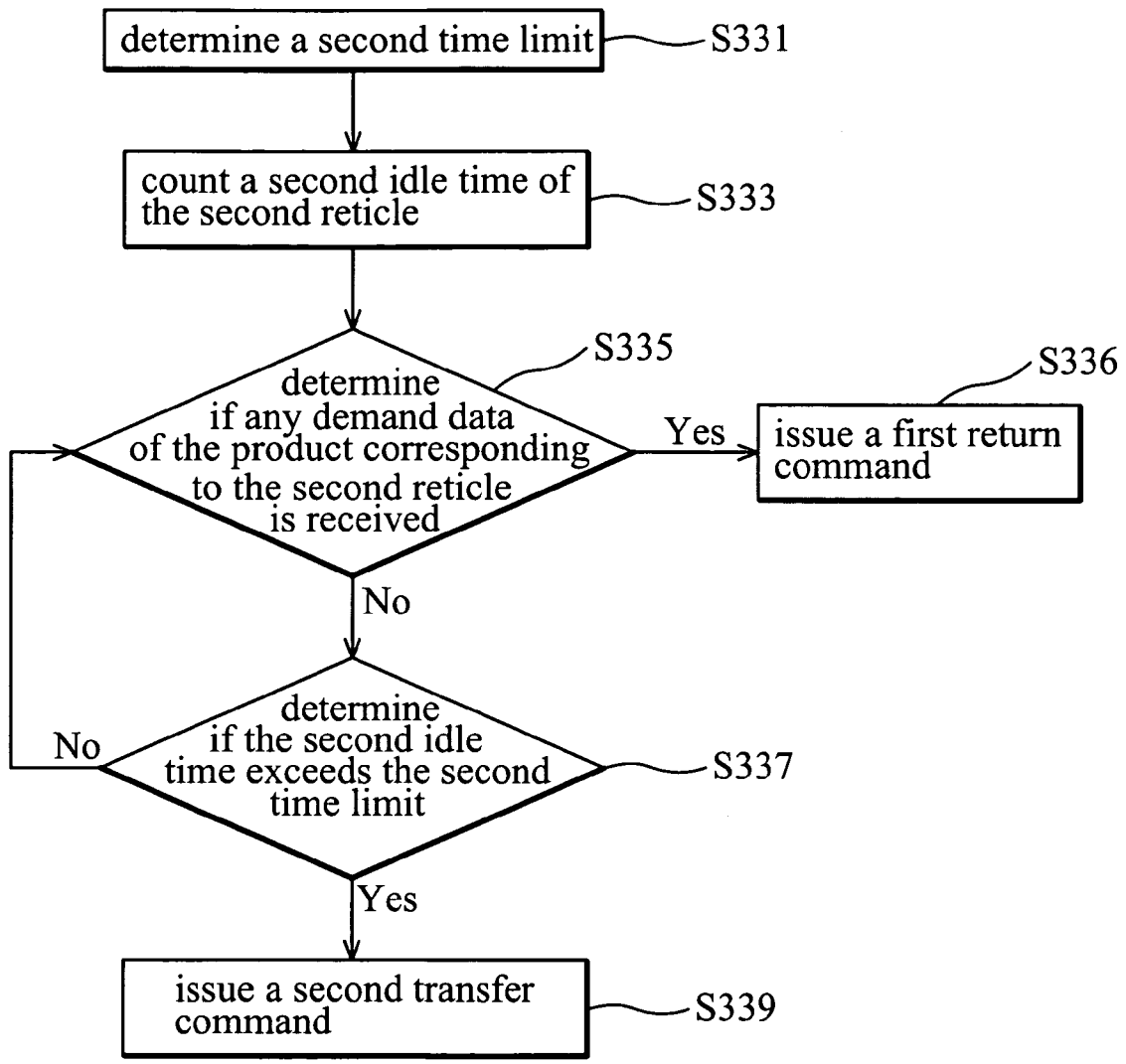

FIGS. 3A and 3B are flowcharts showing the operation of reticle management of the present invention. The reticle management method showed in FIGS. 3A and 3B manages the reticles in the fabrication system described above and shown in FIG. 2.

Using FIG. 3A as an example, a first time limit is set in step S311. The first time limit is the maximum allowable idle time for the first reticle in the online reticle storage. The first time limit can be determined different ways. According to this embodiment, the first time limit is based primarily on a customer's specification, and is further modified by an operator in the fabrication plant.

Next, a first idle time of the first reticle is calculated by an internal counter of the reticle management center 27 (step S313). It is determined if any demand data of the product corresponding to the first reticle has been sent to the order database 28 and transferred to the reticle management center 27 (step S315), and if so, the first idle time is reset to 0, otherwise the method proceeds to step S317. In step S317, it is determined whether the first idle time exceeds the first time limit, and if so, a first transfer command is issued to move the first reticle from the online reticle storage to the offline reticle storage (step S319).

Referring to FIG. 3B, a second time limit is set in step S331. The second time limit is the maximum allowable idle time for the second reticle in the offline reticle storage. The second time limit can be determined different ways. According to this embodiment, the second time limit is based primarily on a customer's specification, and is further modified by an operator in the fabrication plant.

Second, a second idle time of the second reticle is calculated by an internal counter of the reticle management center 27 (step S333). In step S335, it is determined if any demand data corresponding to the second reticle has been sent, and if so, the method proceeds to step S336, otherwise the method proceeds to step S337. In step S336, a first return command is issued, directing the transport device 22 to return the second reticle from the offline reticle storage to the online reticle storage. In step S337, it is determined whether the second idle time exceeds the second time limit, and if so, a second transfer command is issued, directing the transport device 24 to transfer the second reticle from the offline reticle storage to the reticle outlet (step S339).

When the second reticle is sent to the reticle outlet 25, it is classified as a third reticle and sent to the scrap mill 291 or return the reticle storage of the customer 29 according to prior agreement. When demand data of the product corresponding to the third reticle is received, a second return command is issued to move the third reticle from the reticle outlet to the online reticle or offline storage.

The method of the present invention, or certain aspects or portions thereof, may take the form of program code (i.e. instructions) embodied in a tangible media, such as floppy diskettes, CD-ROMS, hard drives, or any other machine-readable storage medium, wherein, when the program code is loaded into and executed by a machine, such as a computer, the machine becomes an apparatus for practicing the invention. The methods and apparatus of the present invention may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing the invention. When implemented on a general-purpose processor, the program code combines with the processor to provide a unique apparatus that operates analogously to specific logic circuits.

Figure 4:
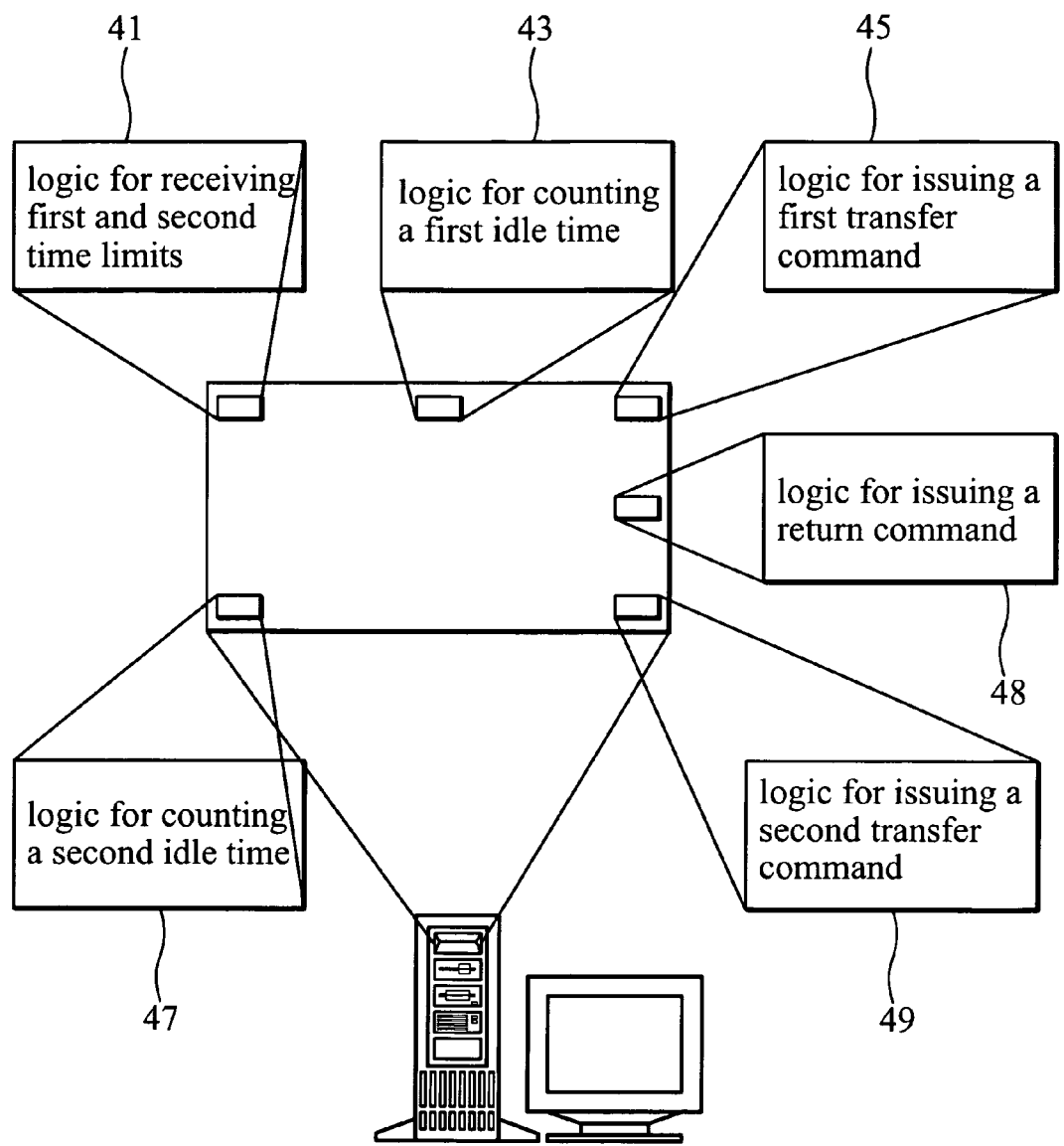
FIG. 4 is a diagram of a storage medium storing a computer program providing the reticle management method.

FIG. 4 is a diagram of a storage medium storing a computer program providing the reticle management method according to the present invention. The computer program product comprises a computer usable storage medium having computer readable program code embodied in the medium, the computer readable program code comprising computer readable program code 41 receiving first and second time limits, computer readable program code 43 counting a first idle time and resetting the first idle time when a demand data of a product corresponding to the first tool is received, computer readable program code 45 issuing a first transfer command to move the first tool from a first tool storage to a second tool storage when the first idle time exceeds the first time limit, computer readable program code 47 counting a second idle time and resetting the second idle time when a demand data of the product corresponding to the second tool is received, computer readable program code 48 issuing a return command, and computer readable program code 49 issuing a second transfer command to move the second tool from the second tool storage to a third tool storage when the second idle time exceeds the second time limit.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A tool stocking and sorting system, comprising:
first tool storage storing a first tool currently in use;
second tool storage storing a second tool not currently in use;
third tool storage serving as an outlet for a third tool not in use; and
a host system adapted to re-locate the first, second, and third tools among the first, second, and third storage as a function of demand data pertaining to a product corresponding to the respective tool,
wherein the first, second and third tools are reticles.

2. The system of claim 1, wherein the demand data is order or order prediction data.

3. The system of claim 1, wherein the host system calculates a first idle time, and resets the first idle time when demand data of the product corresponding to the first tool is received.

4. The system of claim 3, wherein the host system determines a first time limit, and issues a first transfer command to move the first tool from first tool storage to second tool storage when the first idle time exceeds the first time limit.

5. The system of claim 1, wherein the host system issues a first return command to move the second tool from second tool storage to first tool storage when demand data of the product corresponding to the second tool is received.

6. The system of claim 1, wherein the host system determines a second time limit, calculates a second idle time, and issues a second transfer command to move the second tool from second tool storage to third tool storage when the second idle time exceeds the second time limit.

7. The system of claim 1, wherein the host system issues a second return command to move the third tool from third tool storage to first tool storage when demand data of the product corresponding to the third tool is received.

8. A tool stocking and sorting method, comprising:
providing first, second and third tool storage storing first, second, and third tools respectively; and
relocating the first, second, and third tools among the first, second, and third tool storage as a function of demand data pertaining to a product corresponding to the respective tool,
wherein the first, second and third tools are reticles.

9. The method of claim 8, wherein the demand data is order or order prediction data.

10. The method of claim 8, further comprising:
determining a first time limit;
calculating a first idle time of the first tool, and resetting the first idle time when demand data of the product corresponding to the first tool is received;
issuing a first transfer command to move the first tool from first tool storage to second tool storage when the first idle time exceeds the first time limit.

11. The method of claim 8, further comprising:
determining a second time limit;
calculating a second idle time, and resetting the second idle time when demand data of the product corresponding to the second tool is received; and
issuing a second transfer command to move the second tool from second tool storage to third tool storage when the second idle time exceeds the second time limit.

12. The method of claim 11, further comprising issuing a first return command to return the second tool from second tool storage to first tool storage when demand data of the product corresponding to the second tool is received.

13. The method of claim 8, further comprising issuing a second return command to return the third tool from third tool storage to first tool storage when demand data of the product corresponding to the third tool is received.

14. A computer readable storage medium for storing a computer program providing a tool management method controlling storing and sorting of tools in a manufacturing system, the method comprising:
receiving first and second time limits;
calculating a first idle time and resetting the first idle time when demand data of a product corresponding to a first tool is received;
issuing a first transfer command to move the first tool from first tool storage to second tool storage when the first idle time exceeds the first time limit;
calculating a second idle time and resetting the second idle time when demand data of the product corresponding to a second tool is received; and
issuing a second transfer command to move the second tool from second tool storage to third tool storage when the second idle time exceeds the second time limit,
wherein the first, second and third tools are reticles.

15. The storage medium of claim 14, wherein the method further comprises issuing a first return command to return the second tool from second tool storage to first tool storage when demand data of the product corresponding to the second tool is received.

16. The storage medium of claim 14, wherein the method further comprises issuing a second return command to return the third tool from third tool storage to second tool storage when demand data of the product corresponding to the third tool is received.

17. The storage medium of claim 14, wherein the demand data is order or order prediction data.

* * * * *